(12) United States Patent
Koscielnik et al.

(10) Patent No.: US 8,878,714 B2
(45) Date of Patent: *Nov. 4, 2014

(54) METHOD AND APPARATUS FOR CLOCKLESS CONVERSION OF VOLTAGE VALUE TO DIGITAL WORD

(71) Applicants: Dariusz Koscielnik, Cracow (PL); Marek Miskowicz, Cracow (PL)

(72) Inventors: Dariusz Koscielnik, Cracow (PL); Marek Miskowicz, Cracow (PL)

(73) Assignee: Akademia Gorniczo-Hutnicza Im. Stanislawa Staszica, Krakow (PL)

( * ) Notice: Subject to any disclaimer, the term of this patent is extended or adjusted under 35 U.S.C. 154(b) by 0 days.

This patent is subject to a terminal disclaimer.

(21) Appl. No.: 13/755,002

(22) Filed: Jan. 31, 2013

(65) Prior Publication Data
US 2013/0194123 A1    Aug. 1, 2013

(30) Foreign Application Priority Data

Jan. 31, 2012    (PL) .................................... 397 950

(51) Int. Cl.
*H03M 1/34*    (2006.01)
*H03M 1/12*    (2006.01)
*H03M 1/46*    (2006.01)

(52) U.S. Cl.
CPC ............... *H03M 1/12* (2013.01); *H03M 1/125* (2013.01); *H03M 1/466* (2013.01)

USPC ............................................ 341/163; 341/155

(58) Field of Classification Search
USPC ........................................ 341/155, 163, 172
See application file for complete search history.

(56) References Cited

U.S. PATENT DOCUMENTS 7,268,719 B2 *  9/2007  Terazawa et al. ............. 341/157
7,609,194 B2 * 10/2009  Makabe et al. ................ 341/155
7,834,793 B2 * 11/2010  Carreau et al. ................ 341/155

* cited by examiner

*Primary Examiner* — Brian Young
(74) *Attorney, Agent, or Firm* — Ladas & Parry LLP

(57) ABSTRACT

Method and apparatus for mapping the converted voltage value by electric charge value proportional to the converted voltage value and in accumulation of charge in the sampling capacitor until the voltage on this capacitor is equal to the converted voltage. Furthermore, realization of the process of that electric charge redistribution in the array of redistribution by changes of states of signals from relevant control outputs and in assignment of relevant values to bits in the digital word by means of the control module. As soon as accumulation of electric charge in the sampling capacitor is terminated, electric charge is accumulated in the additional sampling capacitor then the process of that electric charge redistribution is realized and relevant values are assigned to bits of the digital word. When a trigger signal is detected, next cycle begins and electric charge is accumulated in the sampling capacitor.

8 Claims, 9 Drawing Sheets

METHOD AND APPARATUS FOR CLOCKLESS CONVERSION OF VOLTAGE VALUE TO DIGITAL WORD

The subject of this invention is a method and an apparatus for clockless conversion of a voltage value to a digital word that can be applied in monitoring and control systems.

The method for the anachronous conversion of a voltage value to a digital word known from the Polish patent application P-392924 (PCT/PL2011/050022, published as WO 2011/152745) consists in mapping a converted voltage value to a portion of electric charge proportional to this converted voltage value. A given portion of charge is delivered by the use of the current source and is accumulated in the sampling capacitor. Accumulation of electric charge is realized until the voltage increasing on the sampling capacitor is equal to the converted voltage value. Then, the accumulated electric charge is submitted to the process of redistribution by deploying the charge in the array of capacitors while a capacitance value of each capacitor of a given index is twice as high as a capacitance value of a capacitor of the previous index. During the process of redistribution, the accumulated electric charge is deployed in the capacitors in the array in a way that the obtained voltage equals zero or equals the reference voltage on each capacitor or on each capacitor with the possible exception of one of capacitors. The course of the process of redistribution is controlled by means of the control module on the basis of output signals of the first comparator and of the second comparator. Electric charge is delivered during the process of its accumulation by the use of the first current source and is transferred between capacitors during the process of its redistribution by the use of the second current source. By means of the control module, the value one is assigned to these bits in the digital word that correspond to capacitors on which the voltage equal to the reference voltage value has been obtained and the value zero is assigned to the other bits in the digital word.

In one of variants of this solution, electric charge is accumulated simultaneously in the sampling capacitor and in the capacitor of the highest capacitance value in the array of capacitors which is connected to the sampling capacitor in parallel.

The apparatus for conversion of a voltage value to a digital word is also known from description of Polish patent application P-392924. This apparatus comprises the array of capacitors whose control inputs are connected to the set of the control outputs of the control module. The control module is equipped with the digital output, the complete conversion signal output, the trigger input and two control inputs. The first control input of the control module is connected to the output of the first comparator whose inputs are connected to one pair of outputs of the array of capacitors. The other control input of the control module is connected to the output of the second comparator whose inputs are connected to the other pair of outputs of the array. Furthermore, the source of converted voltage value, the source of supply voltage, the source of auxiliary voltage, the source of the reference voltage, the sampling capacitor and two controlled current sources are connected to the array of capacitors while the control inputs of both controlled current sources are connected appropriately to the control outputs of the control module. The array of capacitors comprises on-off switches, change-over switches and the array of capacitors whose number equals the number of bits in the digital word and a capacitance value of a capacitor of a given index is twice as high as a capacitance value of a capacitor of the previous index. The top plate of the sampling capacitor and the top plate of each capacitor in the array of capacitors are connected through the first on-off switch to the first rail and/or through the second on-off switch to the second rail and the bottom plate is connected through a change-over switch to ground of the circuit or to the source of auxiliary voltage. The first rail is connected to ground of the circuit through the first rail on-off switch and to the non-inverting input of the second comparator whose inverting input is connected to the source of converted voltage or to the source of the reference voltage through the voltage change-over switch. The second rail is connected to the inverting input of the first comparator whose non-inverting input is connected to the source of auxiliary voltage. The control inputs of the first on-off switches and the control inputs of the change-over switches in the array of capacitors are coupled together and connected appropriately to the control outputs of the control module while the control inputs of the second on-off switches and the control input of the first rail are connected appropriately to the control outputs of the control module. The control input of the voltage change-over switch is connected to the control output of the control module. The first end of the first current source is connected to the source of supply voltage and the other end of the first current source is connected to the first rail. The other end of the second current source is also connected to the first rail. The first end of the second current source is connected to the second rail.

In one of variants of the abovementioned apparatus, the sampling capacitor whose capacitance value is not smaller than the capacitance value of the capacitor having the highest capacitance value in the array of capacitors is connected in parallel to the capacitor of the highest capacitance value in the array of capacitors. The conversion of the voltage value to the digital word is realized by changing states of signals from the relevant control outputs by means of the control module.

According to the invention, the method for clockless conversion of a voltage value to a digital word consists in that a trigger signal is detected by the use of the control module and a converted voltage value is mapped by a portion of electric charge which is proportional to the converted voltage value. Electric charge is delivered by the use of the current source and is accumulated in the sampling capacitor, or in the sampling capacitor and in the capacitor of the highest capacitance value in the array of redistribution, which is connected to the sampling capacitor in parallel, until the voltage increasing on the sampling capacitor observed at the same time by the use of the comparator is equal to the converted voltage. Then, the process of redistribution of the accumulated electric charge is realized in the array of redistribution in a known way by changing states of signals from the relevant control outputs by the use of the control module and the relevant values are assigned to bits in the digital word by means of the control module. The array of redistribution comprises the set of on-off switches, of change-over switches and of capacitors while a capacitance value of each capacitor of a given index is twice as high as a capacitance value of a capacitor of the previous index.

The essence of the method, according to the invention, consists in that as soon as accumulation of electric charge is terminated in the sampling capacitor, or in the sampling capacitor and in the capacitor of the highest capacitance value in the array of redistribution, which is connected to the sampling capacitor in parallel and as soon as the trigger signal is detected by means of the control module, electric charge is delivered by the use of current source and accumulated in the additional sampling capacitor. Next the process of redistribution of electric charge accumulated in the additional sampling capacitor is realized and the relevant values are assigned to bits in the digital word by means of the control module. The accumulation of electric charge in the additional sampling capacitor, the process of redistribution of electric charge accumulated in the additional sampling capacitor and assignment of the relevant values to bits in the digital word by means of the control module are realized as for the sampling capacitor.

In this method, it is possible that as soon as the accumulation of electric charge is terminated in the additional sampling capacitor and as soon as the trigger signal is detected by means of the control module, the next cycle begins and electric charge is delivered by the use of the current source and accumulated again in the additional sampling capacitor or in the sampling capacitor and in the capacitor of the highest capacitance value in the array of redistribution which is connected to the sampling capacitor in parallel.

In this method, it is possible that during a period of time when electric charge is delivered by the use of current source and accumulated in the additional sampling capacitor, a part of the delivered electric charge is simultaneously accumulated in the additional capacitor having the highest capacitance value in the array of redistribution which is connected to the additional sampling capacitor in parallel. A capacitance value of the additional capacitor having the highest capacitance value in the array of redistribution equals the capacitance value of the capacitor having the highest capacitance value in the array of redistribution.

In this method it is also possible that as soon as the process of redistribution is terminated, the portion of electric charge, accumulated in the last of capacitors on which reference voltage had not been reached when the process of redistribution was realized, is conserved. This portion of electric charge is taken into account when the next process of redistribution is realized.

The apparatus, according to the invention, comprises the array of redistribution whose control inputs are connected to control outputs of the control module. The control module is equipped with the digital output, the complete conversion signal output, the trigger input, the first control input which is connected to the output of the first comparator and the other control input which is connected to the output of the second comparator. The source of auxiliary voltage, the section of the sampling capacitor and the second controlled current source whose control input is connected to the relevant output controlling the second current source are connected to the array of redistribution. The first end of the second current source is connected to the source rail and the other end of the second current source is connected to the destination rail. The source of supply voltage is connected to the first end of the first current source whose control input is connected to the output controlling the first current source. The array of redistribution comprises the sections whose number equals the number of bits in the digital word. The section of the sampling capacitor and each section of the array of redistribution comprises the source on-off switch, the destination on-off switch, the ground change-over switch and at least one capacitor. The top plate of the sampling capacitor and the top plate of each capacitor in the array of redistribution is connected through the source on-off switch to the source rail and/or through the destination on-off switch to the destination rail and the bottom plate is connected through the ground change-over switch to ground of the circuit or to the source of auxiliary voltage. In the array of redistribution, a capacitance value of each capacitor of a given index is twice as high as a capacitance value of a capacitor of the previous index. The destination rail is connected through the on-off switch of the destination rail to ground of the circuit and is also connected to the non-inverting input of the second comparator whose inverting input is connected to the source of the reference voltage. The source rail is connected to the inverting input of the first comparator whose non-inverting input is connected to the source of auxiliary voltage. The control inputs of the source on-off switches and the control input of the on-off switch of the destination rail are connected appropriately to control outputs of the control module. The control inputs of destination on-off switches and the control inputs of the ground change-over switches are coupled together and connected appropriately to the control outputs of the control module.

A significant innovation of the apparatus is that the control module is equipped with the third control input connected to the output of the third comparator whose inverting input is connected to the source of converted voltage. The non-inverting input of the third comparator is connected to the other end of the first current source and to the section of the sampling capacitor which comprises the additional sampling capacitor, the top plate change-over switches and the bottom plate change-over switches. The top plate of the sampling capacitor and the top plate of the additional sampling capacitor are connected to the source on-off switch and to the destination on-off switch or to the other end of the first current source and to the non-inverting input of the third comparator through the top plate change-over switches. The bottom plate of the sampling capacitor and the bottom plate of the additional sampling capacitor are connected to the ground change-over switch or to ground of the circuit by the bottom plate change-over switches. The control inputs of the top plate change-over switches and the control inputs of the bottom plate change-over switches are coupled together and connected to the output controlling change-over switches of plates.

It is advantageous if at least one section of the array of redistribution comprises the additional capacitor and the top plate change-over switches and the bottom plate change-over switches. The top plate of the capacitor and the top plates of the additional capacitor of such section are connected to the source on-off switch and to the destination on-off switch or to the other end of the first current source and to the non-inverting input of the third comparator through the top plate change-over switches. The bottom plate of the capacitor and the bottom plate of the additional capacitor of such section are connected to the ground change-over switch or to ground of the circuit through the bottom plate change-over switches. The control inputs of the top plate change-over switches and the control inputs of bottom plate change-over switches are coupled together and connected to the output controlling change-over switches of plates.

It is advantageous if the capacitance values of the sampling capacitor and of the additional sampling capacitor are not smaller than the capacitance value of the capacitor having the highest capacitance value in the array of redistribution.

It is also advantageous if the capacitance value of the additional capacitor in the array of redistribution equals appropriately the capacitance value of the capacitor in the array of redistribution.

A use of an additional sampling capacitor enables a realization of two successive sampling phases of converted voltage without the need to introduce a break to realize the process of redistribution of the accumulated charge and the relaxation phase between those two phases. The accumulation of a portion of electric charge representing the value of the next sample in the additional sampling capacitor is realized simultaneously to the process of redistribution of the portion of charge in the sampling capacitor while this portion of charge represents the first sample. In this way, the results of each conversion are presented with minimal delay equal to the time of realization of the process of charge redistribution. Moreover, the realization of actions related to the conversions of both voltage samples by the same control module, by the array of redistribution, by the set of comparators and by the set of current sources contributes to a reduction of amount of energy consumed per single conversion by the apparatus and in this way increases energy efficiency of its operation.

A start of a new sampling phase of converted voltage after the end of the actual sampling phase enables achievement of the maximum frequency of collecting and converting a sequence of samples by means of a single apparatus. The need of breaks between following sampling phases introduced to realize the process of redistribution of the accumulated electric charge and to realize the relaxation phase is avoided.

A use of an additional capacitor having the highest capacitance value in the array of redistribution allows the required capacitance value of the sampling capacitor to be reduced twice and enables a significant reduction of area occupied by a converter produced in a form of the monolithic integrated circuit. Due to a parallel connection of the additional sampling capacitor to the additional capacitor having the highest capacitance value in the array of redistribution, the maximum voltage value created on the additional sampling capacitor having the reduced capacitance value is not increased. Furthermore, the time of realization of redistribution of charge, accumulated in the additional sampling capacitor and in the additional capacitor having the highest capacitance value in the array of redistribution connected to the additional sampling capacitor in parallel, is smaller at least by 25%.

Due to the fact that the apparatus is equipped with the third comparator, it is possible to realize the process of redistribution of a portion of electric charge accumulated previously and a simultaneous control of the process of accumulation of the next portion of electric charge representing a value of next sample.

Conserving in the apparatus a small portion of charge which has not been taken into consideration in the value of a digital word is also an advantage. The inclusion of the abovementioned portion of charge during the process of redistribution of the subsequent accumulated charge value causes that the average value of digital output represents the average value of samples with the resolution defined by the quantization error.

The subject of the invention is explained in the exemplary realizations by means of figures where the apparatus is shown at different phases of conversion process represented by different states of on-off switches and change-over switches:

Figure 1:
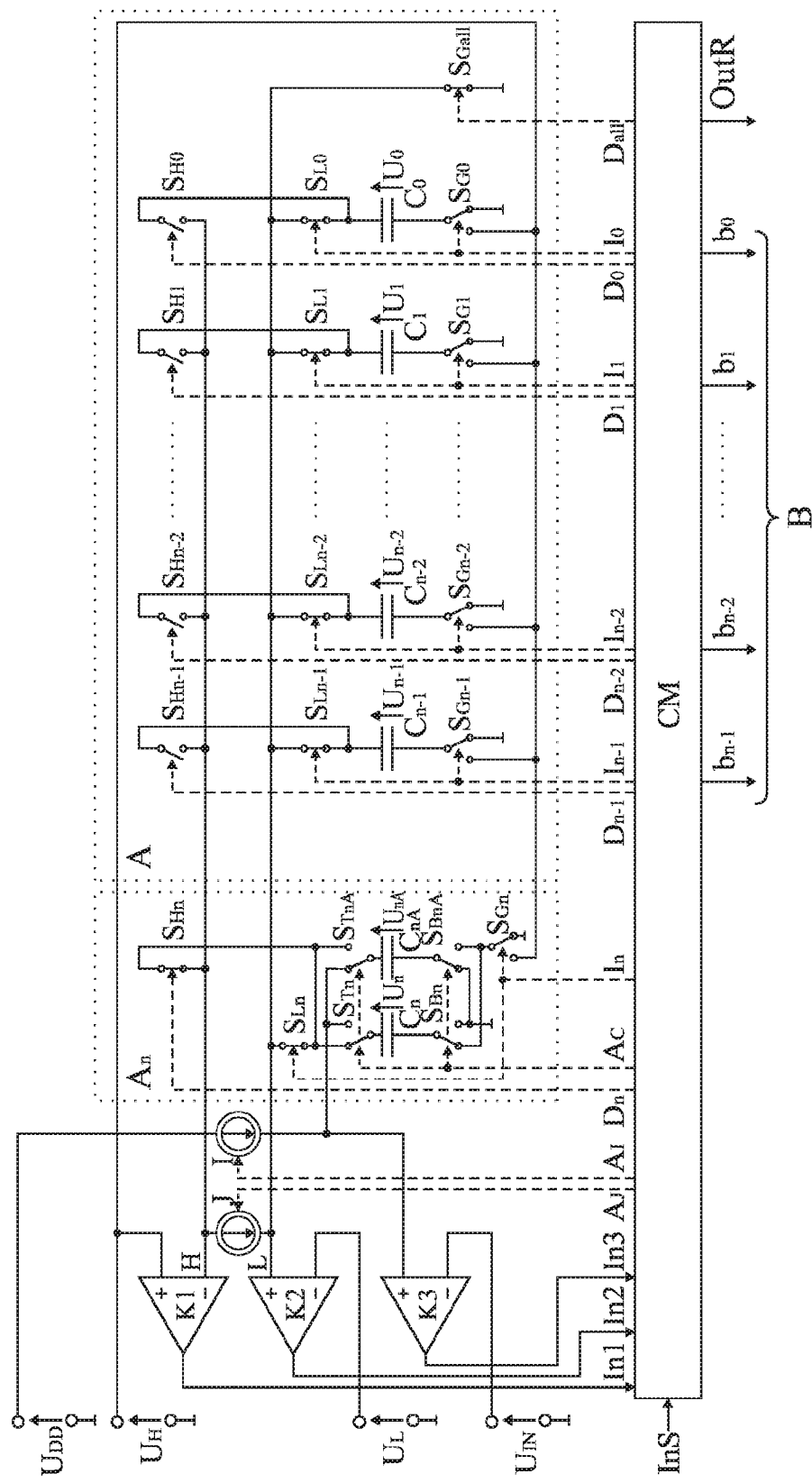
FIG. 1 illustrates the schematic diagram of the apparatus in the state of relaxation before the start of conversion.

According to the invention, the method for clockless conversion of a voltage value to a digital word consists in that a trigger signal is detected by the use of the control module CM and the converted voltage value $C_{IN}$ is mapped by a portion of electric charge which is proportional to the converted voltage value. Electric charge is delivered by the use of the first current source I and is accumulated in the sampling capacitor $C_n$ until the voltage $U_n$ on the sampling capacitor observed at the same time by the use of the third comparator K3 is equal to the converted voltage $U_{IN}$. Then, the process of redistribution of the accumulated charge is realized in the array of redistribution A by means of the control module CM by changing the states of the signals from the relevant control outputs and the relevant values are assigned to the bits $b_{n-1}$, $b_{n-2}, \ldots, b_1, b_0$ in digital word by means of the control module CM. The array of redistribution A comprises the set of on-off switches, of change-over switches and of capacitors while a capacitance value of a capacitor of a given index is twice as high as a capacitance value of a capacitor of the previous index.

As soon as accumulation of charge in the sampling capacitor $C_n$ is terminated and when the trigger signal is detected by means of the control module CM, electric charge is delivered by the use of the first current source I and accumulated in the additional sampling capacitor $C_{nA}$. Next, the process of redistribution of charge accumulated in the additional sampling capacitor $C_{nA}$ is realized and the relevant values are assigned to the bits $b_{n-1}, b_{n-2}, \ldots, b_1, b_0$ in the digital word by means of the control module CM. The accumulation of charge in the additional sampling capacitor $C_{nA}$, the process of redistribution of charge accumulated in the additional sampling capacitor $C_{nA}$ and the assignment of relevant values to the bits $b_{n-1}, b_{n-2}, \ldots, b_1, b_0$ in the digital word are realized in the same way as for the sampling capacitor $C_n$.

The another exemplary solution is characterized in that as soon as accumulation of electric charge in the additional sampling capacitor $C_{nA}$ is terminated and when the trigger signal is detected by means of the control module CM, the next cycle begins and the charge is delivered by the use of the first current source I and accumulated in the sampling capacitor $C_n$ again.

The another exemplary solution is characterized in that when the charge is delivered by the use of the first current source I and accumulated in the additional sampling capacitor $C_{nA}$, the part of delivered charge in this example is accumulated simultaneously in the additional capacitor $C_{n-1A}$ having the highest capacitance value in the array of redistribution which is connected to the additional sampling capacitor $C_{nA}$ in parallel. A capacitance value of the additional capacitor $C_{n-1A}$ having the highest capacitance value in the array of redistribution is equal to the capacitance value of the capacitor $C_{n-1}$ having the highest capacitance value in the array of redistribution.

The another exemplary solution is characterized in that as soon as the process of redistribution is terminated in the last of capacitors on which reference voltage $U_L$ had not been reached when the process of redistribution is realized, the charge accumulated in the last of capacitors is conserved.

In detail, the abovementioned process of redistribution in the exemplary solution is presented as follows.

As soon as accumulation of electric charge in the sampling capacitor $C_n$ is terminated, the function of the source capacitor $C_i$ whose index is defined by the content of the source index register, is assigned by means of the control module CM to the sampling capacitor $C_n$ by writing the value of the index of the sampling capacitor $C_n$ to this register. Simultaneously, the function of the destination capacitor $C_k$, whose index is defined by the content of the destination index register, is assigned by means of the control module CM to the capacitor $C_{n-1}$ having the highest capacitance value in the array of redistribution by writing the value of the index of the capacitor $C_{n-1}$ to this register. Then, the process of redistribution of the accumulated charge is realized by transfer of the charge from the source capacitor $C_i$ to the destination capacitor $C_k$ by the use of the second current source J having the effectiveness twice as high as effectiveness of the first current source I. At the same time, the voltage $U_k$ increasing on the destination capacitor $C_k$ is compared to the reference voltage $U_L$ by the use of the second comparator K2, and also the voltage $U_i$ on the source capacitor $C_i$ is observed by the use of the first comparator K1.

When the voltage $U_i$ on the source capacitor $C_i$ observed by the use of the first comparator K1 equals zero during the charge transfer, the function of the source capacitor $C_i$ is assigned to the current destination capacitor $C_k$ by means of the control module CM on the basis of the output signal of the first comparator K1 by writing the current content of the destination index register to the source index register, and the function of the destination capacitor $C_k$ is assigned to the subsequent capacitor in the array of redistribution A whose capacitance value is twice lower than the capacitance value of the capacitor that acted as the destination capacitor directly before by reducing the content of the destination index register by one, and the charge transfer from a new source capacitor $C_i$ to a new destination capacitor $C_k$ is continued by the use of the second current source J.

When the voltage $U_k$ on the destination capacitor $C_k$ observed by the use of the second comparator K2 equals the reference voltage $U_L$ during the transfer of charge from the source capacitor $C_i$ to the destination capacitor $C_k$, the function of the destination capacitor $C_k$ is assigned by means of the control module CM on the basis of the output signal of the second comparator K2 to the subsequent capacitor in the array of redistribution A whose capacitance value is twice lower than the capacitance value of the capacitor that acted as the destination capacitor directly before by reducing the content of the destination index register by one, and also the charge transfer from the source capacitor $C_i$ to a new destination capacitor $C_k$ is continued.

The process of redistribution is still controlled by means of the control module CM on the basis of the output signals of the first comparator K1 and of the second comparator K2 until the voltage $U_i$ on the source capacitor $C_i$ observed by the use of the first comparator K1 equals zero during the period of time when the function of the destination capacitor $C_k$ is assigned to the capacitor $C_0$ having the lowest capacitance value in the array of redistribution, or the voltage $U_0$ increasing on the capacitor $C_0$ having the lowest capacitance value in the array of redistribution and observed at the same time by the use of the second comparator K2 equals the reference voltage $U_L$. The value one is assigned to the bits in the digital word corresponding to the capacitors in the array of redistribution on which the voltage equal to the reference voltage value $U_L$ has been obtained, and the value zero is assigned to the other bits by means of the control module CM.

According to the invention, the apparatus for clockless conversion of the voltage value to the digital word comprises the array of redistribution A whose control inputs are connected to control outputs of the control module CM. The control module CM is equipped with the digital output B, the complete conversion output OutR, the trigger input InS, the first control input Int connected to the output of the first comparator K1, the second control input Int connected to the output of the second comparator K2 and the third control input In3 connected to the output of the third comparator K3. The source of auxiliary voltage $U_H$, the section of the sampling capacitor $A_n$ and the second controlled current source J having the effectiveness twice as high as effectiveness of the first current source I are connected to the array of redistribution A. The control input of the second current source J is connected to the output controlling the second current source $A_J$. The first end of the second current source J is connected to the source rail H and the other end of the second current source J is connected to the destination rail L. The source of supply voltage $U_{DD}$ is connected to the first end of the first current source I whose control input is connected to the output controlling the first current source $A_I$. The array of redistribution comprises the sections whose number n equals the number of bits in the digital word. The section of the sampling capacitor $A_n$ and the sections of the array of redistribution A comprises the source on-off switches $S_{Hn}$; $S_{Hn-1}$, $S_{Hn-2}$, ..., $S_{H1}$, $S_{H0}$, the destination on-off switches $S_{Ln}$; $S_{Ln-1}$, $S_{Ln-2}$, ..., $S_{L1}$, $S_{L0}$, the ground change-over switches $S_{Gn}$; $S_{Gn-1}$, $S_{Gn-2}$, ..., $S_{G1}$, $S_{G0}$ and the capacitors $C_n$; $C_{n-1}$, $C_{n-2}$, ..., $C_1$, $C_0$. The top plates of the capacitors $C_{n-1}$, $C_{n-2}$, ..., $C_1$, $C_0$ of the array of redistribution are connected to the source rail H through the source on-off switches $S_{Hn-1}$, $S_{Hn-2}$, ..., $S_{H1}$, $S_{H0}$ and to the destination rail L through the destination on-off switches $S_{Ln-1}$, $S_{Ln-2}$, ..., $S_{L1}$, $S_{L0}$. The bottom plates of these capacitors are connected to ground of the circuit and to the source of auxiliary voltage $U_H$ through the ground change-over switches $S_{Gn-1}$, $S_{Gn-2}$, ..., $S_{G1}$, $S_{G0}$. In the array of redistribution A, a capacitance value of each capacitor $C_{n-1}$, $C_{n-2}$, ..., $C_1$, $C_0$ of a given index is twice as high as a capacitance value of a capacitor of the previous index. The capacitance value of the sampling capacitor $C_n$ is twice as high as the capacitance value of the capacitor $C_{n-1}$ having the highest capacitance value in the array of redistribution. The relevant bit $b_{n-1}$, $b_{n-2}$, ..., $b_1$, $b_0$ in the digital word is assigned to each capacitor $C_{n-1}$, $C_{n-2}$, ..., $C_1$, $C_0$ in the array of redistribution. The destination rail L is connected through the on-off switch of the destination rail $S_{Gall}$ to ground of the circuit and is also connected to the non-inverting input of the second comparator K2 whose inverting input is connected to the source of the reference voltage $U_L$. The source rail H is connected to the inverting input of the first comparator K1 whose non-inverting input is connected to the source of auxiliary voltage $U_H$. The control inputs of the source on-off switches $S_{Hn}$; $S_{Hn-1}$, $S_{Hn-2}$, ..., $S_{H1}$, $S_{H0}$ and the control inputs of the on-off switch of the destination rail $S_{Gall}$ are connected appropriately to the control outputs $D_n$; $D_{n-1}$, $D_{n-2}$, ..., $D_1$, $D_0$; $D_{all}$. The control inputs of the destination on-off switches $S_{Ln}$; $S_{Ln-1}$, $S_{Ln-2}$, ..., $S_{L1}$, $S_{L0}$ and the control inputs of the ground change-over switches $S_{Gn}$; $S_{Gn-1}$, $S_{Gn-2}$, ..., $S_{G1}$, $S_{G0}$ are coupled together and connected appropriately to the control outputs $I_n$; $I_{n-1}$, $I_{n-2}$, ..., $I_1$, $I_0$. The inverting input of the third comparator K3 is connected to the source of converted voltage $U_{IN}$. The non-inverting input of the third comparator K3 is connected to the other end of the first current source I and to the section of the sampling capacitor $A_n$ which comprises the additional sampling A capacitor $C_{nA}$, the top plate change-over switches $S_{Tn}$, $S_{TnA}$, the bottom plate change-over switches $S_{Bn}$, $S_{BnA}$. The capacitance value of the additional sampling capacitor $C_{nA}$ is equal to the capacitance value of the sampling capacitor $C_n$. The top plate of the sampling capacitor $C_n$ and the top plate of the additional sampling capacitor $C_{nA}$ are connected to the source on-off switch $S_{Hn}$, to the to the destination on-off switch $S_{Ln}$, to the to the other end of the first current source I and to the non-inverting input of the third comparator K3 through the top plate change-over switches $S_{Tn}$, $S_{TnA}$. The bottom plates of the sampling capacitor $C_n$ and the bottom plates of the additional sampling capacitor $C_{nA}$ are connected to the ground change-over switch $S_{Gn}$ and to ground of the circuit through the bottom plate change-over switches $S_{Bn}$, $S_{BnA}$. The control inputs of the top plate change-over switches $S_{Tn}$, $S_{TnA}$ and the control inputs of the bottom plate change-over switches $S_{Bn}$, $S_{BnA}$ are coupled together and connected to the output controlling the change-over switches of plates $A_C$. The source on-off switch $S_{Hn}$ is connected to the source rail H, the destination on-off switch $S_{Ln}$ is connected to the destination rail L and the ground change-over switch $S_{Gn}$ is connected to ground of the circuit and to the source of auxiliary voltage $U_H$.

In the another exemplary solution, the section of the capacitor $C_{n-1}$ having the highest capacitance value in the array of redistribution comprises the additional capacitor $C_{n-1A}$ having the highest capacitance value in the array of redistribution, the top plate change-over switches $S_{Tn-1}$, $S_{Tn-1A}$ and the bottom plate change-over switches $S_{Bn-1}$, $S_{Bn-1A}$. The capacitance value of the additional capacitor $C_{n-1A}$ having the highest capacitance value in the array of redistribution is equal to the capacitance value of the capacitor $C_{n-1}$ having the highest capacitance value in the array of redistribution. The top plates of the capacitor $C_{n-1}$ having the highest capacitance value in the array of redistribution and the top plates of the additional capacitor $C_{n-1A}$ having the highest capacitance value in the array of redistribution are connected to the source on-off switch $S_{Hn-1}$, to the destination on-off switch $S_{Ln-1}$, to the other end of the first current source I and to the non-inverting input of the third comparator K3 through the top plate change-over switches $S_{Tn-1}$, $S_{Tn-1A}$. The bottom plates of the capacitor $C_{n-1}$ having the highest capacitance value in the array of redistribution and the top plates of the additional capacitor $C_{n-1A}$ having the highest capacitance value in the array of redistribution are connected to the ground change-over switch $S_{Gn-1}$ and to ground of the circuit through the bottom plate change-over switches $S_{Bn-1}$ $S_{Bn-1A}$. The control inputs of the top plate change-over switches $S_{Tn-1}$, $S_{Tn-1A}$ and the control inputs of the bottom plate change-over switches $S_{Bn-1}$, $S_{Bn-1A}$ are coupled together and connected to the output controlling the change-over switches of plates $A_C$.

The method for conversion of a voltage value to the digital word, according to the invention, is presented in the first exemplary apparatus as follows. Before the first process of conversion of a voltage value to the digital word having the number of bits equal to n, the control module CM introduces the complete conversion output OutR to the inactive state. The control module CM by the use of the signal from the output controlling the first current source $A_I$ causes the switching off the first current source I and by the use of the signal from the output controlling the second current source $A_J$ causes the switching off the first current source J. By the use of the signal from the output controlling the change-over switches of plates $A_C$, the control module CM causes the switching of the top plate change-over switches $S_{Tn}$, $S_{TnA}$ and of the bottom plate change-over switches $S_{Bn}$, and $S_{BnA}$ and the connection of the top plate of the sampling capacitor $C_n$ to the source on-off switch $S_{Hn}$ and to the destination on-off switch $S_{Ln}$, the connection of the top plate of the additional sampling capacitor $C_{nA}$ to the other end of the first current source I and to the non-inverting input of the third comparator K3, the connection of the bottom plate of the sampling capacitor $C_n$ to the ground change-over switch $S_{Gn}$ and the connection of the bottom plate of the additional sampling capacitor $C_{nA}$ to ground of the circuit. Next the control module CM introduces the apparatus into the relaxation state shown in FIG. 1. Therefore, the control module CM causes the opening of the source on-off switches $S_{Hn-1}$, $S_{Hn-2}$, ..., $S_{H1}$, $S_{H0}$ by the use of the signals from the control outputs $D_{n-1}$, $D_{n-2}$, ..., $D_1$, $D_0$. Furthermore, by the use of the signals from the control outputs $I_n$; $I_{n-1}$, $I_{n-2}$, ..., $I_1$, $I_0$, the control module CM causes the closure of the destination on-off switches $S_{Ln}$; $S_{Ln-1}$, $S_{Ln-2}$, ..., $S_{L1}$, $S_{L0}$ and the connection of the top plate of the sampling capacitor $C_n$ and the top plates of all the capacitors $C_{n-1}$, $C_{n-2}$, ..., $C_1$, $C_0$ in the array of redistribution to the destination rail L, the switching of the ground change-over switches $S_{Gn}$; $S_{Gn-1}$, $S_{Gn-2}$, ..., $S_{G1}$, $S_{G0}$ and the connection of the bottom plate of the sampling capacitor $C_n$ and the bottom plates of all the capacitors $C_{n-1}$, $C_{n-2}$, ..., $C_1$, $C_0$ in the array of redistribution to ground of the circuit. By the use of the signal from the control output $D_{all}$, the control module CM causes the closure of the destination rail on-off switch $S_{Gall}$ and the connection of the destination rail L to ground of the circuit enforcing a complete discharge of the sampling capacitor $C_n$ and of all the capacitors $C_{n-1}$, $C_{n-2}$, ..., $C_1$, $C_0$ in the array of redistribution. At the same time, by the use of signal from the control output $D_n$, the control module CM causes the closure of the source on-off switch $S_{Hn}$ and the connection of the source rail H to the destination rail L and to ground of the circuit which prevents the occurrence of a random potential on the source rail H.

Figure 2:
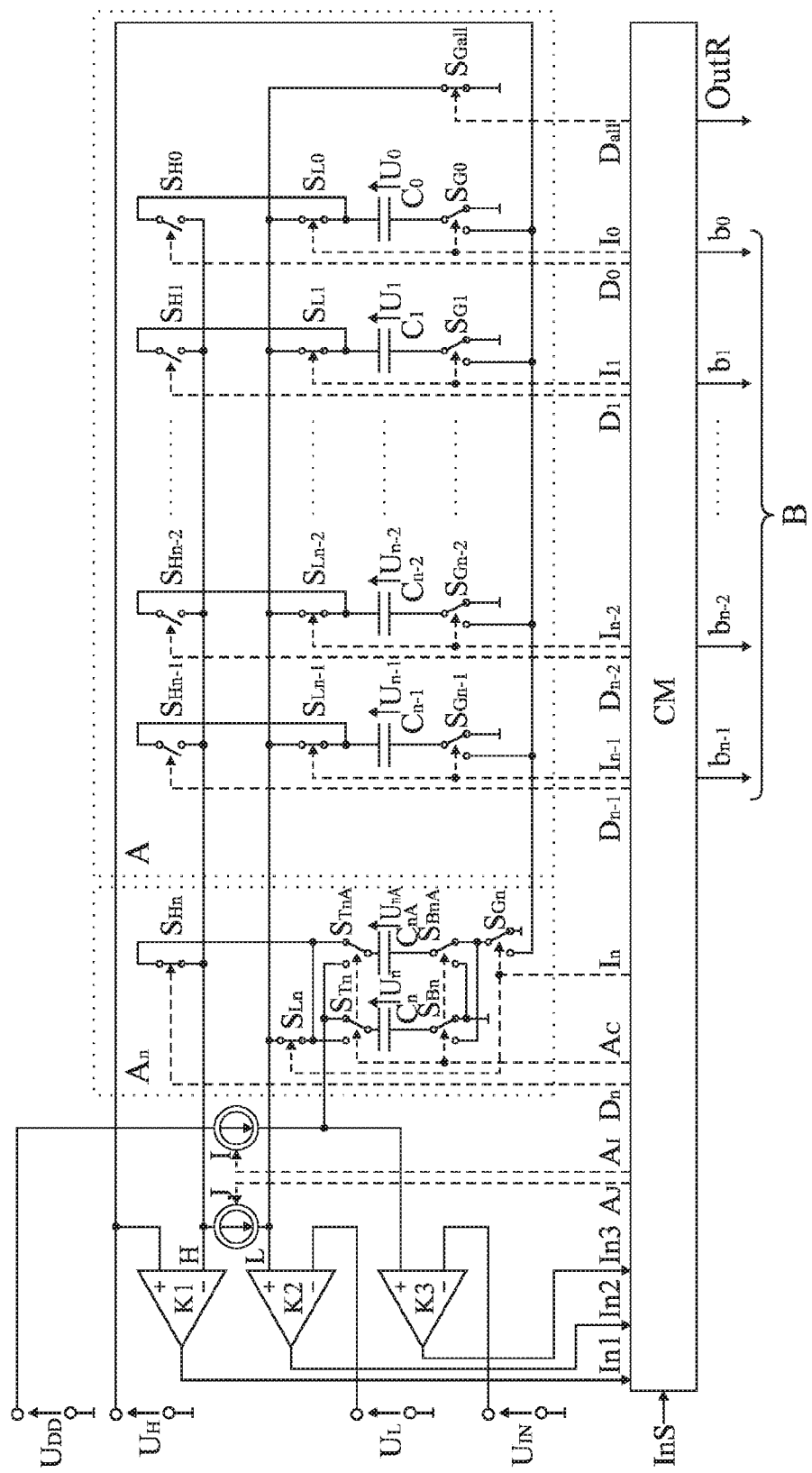
FIG. 2 illustrates the schematic diagram of the apparatus during accumulation of electric charge in the sampling capacitor $C_n$.

As soon as the trigger signal is detected on the trigger input InS by the module CM, the apparatus is introduced into the state shown in FIG. 2 by the use of the module CM. Therefore, by the use of the signal from the output controlling the change-over switches of plates $A_C$, the control module CM causes the switching of the top plate change-over switches $S_{Tn}$, $S_{TnA}$ and of the bottom plate change-over switches $S_{Bn}$, $S_{BnA}$ and the connection of the top plate of the sampling capacitor $C_n$ to the other end of the first current source I and to the non-inverting input of the third comparator K3, the connection of the top plate of the additional sampling capacitor $C_{nA}$ to the source on-off switch $S_{Hn}$ and to the destination on-off switch $S_{Ln}$, the connection of the bottom plate of the sampling capacitor $C_n$ to ground of the circuit and the connection of the bottom plate of the additional sampling capacitor $C_{nA}$ to the ground change-over switch $S_{Gn}$ enforcing a complete discharge of the additional sampling capacitor $C_{nA}$. Next, the control module CM by the use of the signal from the output controlling the first current source $A_I$ causes the switching on the first current source I. Electric charge delivered by the use of the first current source I is accumulated in the sampling capacitor $C_n$ which as the only capacitor is then connected to the other end of the first current source I and to the non-inverting input of the third comparator K3 through the top plate change-over switch $S_{Tn}$. The voltage $U_n$ increasing on the sampling capacitor is compared to the converted voltage $U_N$ by the use of the third comparator K3.

Figure 3:
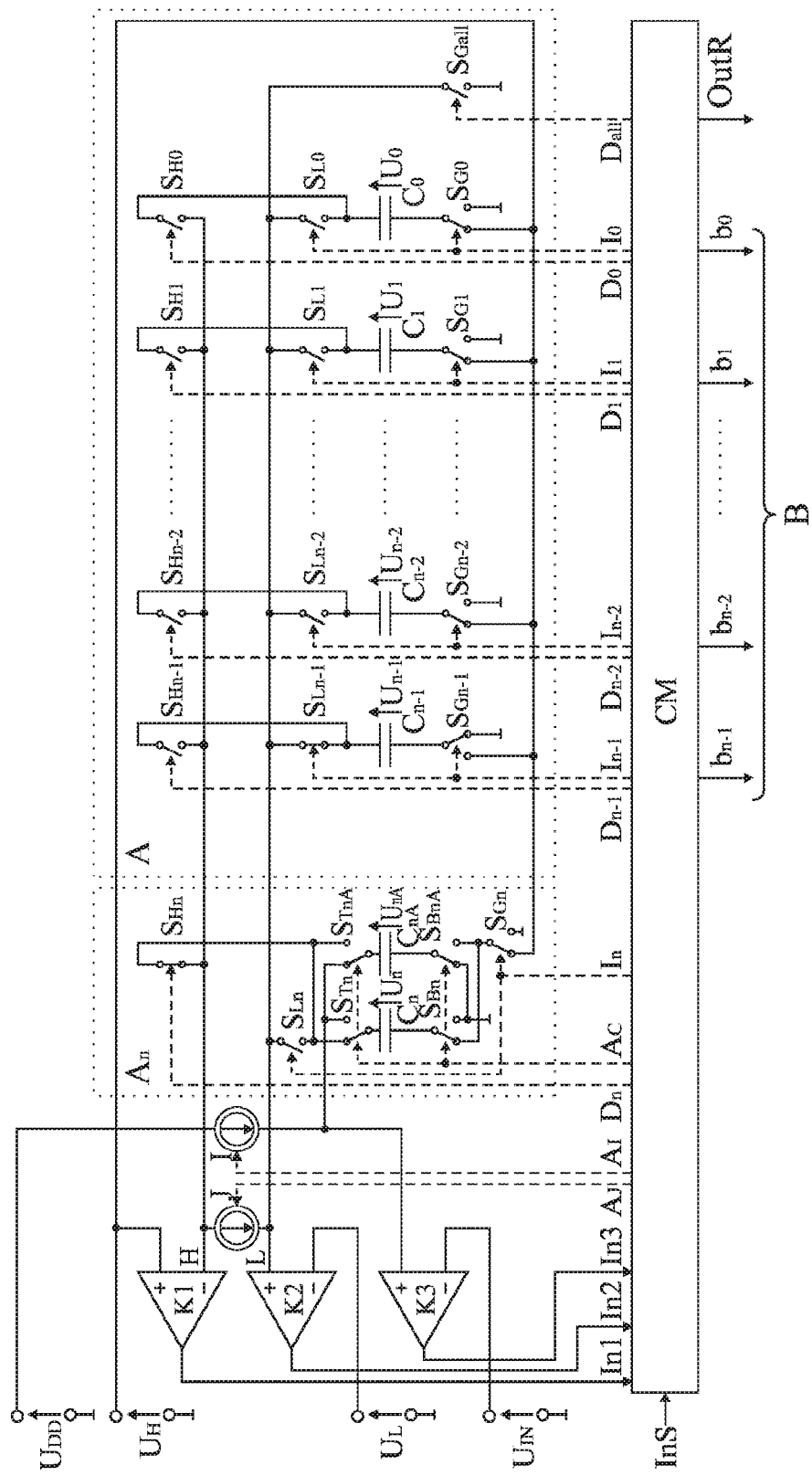
FIG. 3 illustrates the schematic diagram at the beginning of redistribution of charge accumulated in the sampling capacitor $C_n$.

As soon as the voltage $U_n$ on the sampling capacitor reaches the converted voltage value $U_{IN}$, the control module CM on the basis of the output signal of the third comparator K3 introduces the apparatus in the state shown in FIG. 3. Therefore, the control module CM by the use of the signal from the control output $D_{all}$ causes the opening of the destination rail on-off switch $S_{Gall}$ and the disconnection of the destination rail L from ground of the circuit. By the use of the signals from control outputs $I_n$; $I_{n-2}$, ..., $I_1$, $I_0$, the control module CM causes the opening of the destination on-off switches $S_{Ln}$; $S_{Ln-2}$, ..., $S_{L1}$, $S_{L0}$, the disconnection of the top plates of the additional sampling capacitor $C_{nA}$ and of the capacitors $C_{n-2}$, ..., $C_1$, $C_0$ in the array of redistribution from the destination rail L, the switching of the ground change-over switches $S_{Gn}$; $S_{Gn-2}$, ..., $S_{G1}$, $S_{G0}$ and the connection of the bottom plates of the additional sampling capacitor $C_{nA}$ and of the capacitors $C_{n-2}$, ..., $C_1$, $C_0$ in the array of redistribution to the source of auxiliary voltage $U_H$. By the use of the signal from the output controlling the change-over switches of plates $A_C$, the control module CM causes the switching of the top plate change-over switches $S_{Tn}$, $S_{TnA}$ and of the bottom plate change-over switches $S_{Bn}$, $S_{BnA}$ and the connection of the top plate of the sampling capacitor $C_n$ to the source on-off switch $S_{Hn}$ and to the destination on-off switch $S_{Ln}$, the connection of the top plate of the additional sampling capacitor $C_{nA}$ to the other end of the first current source I and to the non-inverting input of the third comparator K3, the connection of the bottom plate of the sampling capacitor $C_n$ to the ground change-over switch $S_{Gn}$ and the connection of the bottom plate of the additional sampling capacitor $C_{nA}$ to ground of the circuit.

In case if the control module CM does not detect the next trigger signal on the trigger input InS when the voltage $U_n$ on the sampling capacitor reaches the converted voltage value $U_{IN}$, the control module CM on the basis of the output signal of the third comparator K3 causes the switching off the first current source I by the use of the signal from the output controlling the first current source $A_I$. As soon as the trigger signal on the trigger input InS is detected by the control module CM, the first current source I, the control module CM by the use of the signal from the output controlling the first current source $A_I$ causes the switching on the first current source I again. Electric charge delivered by the use of the first current source I is accumulated in the additional sampling capacitor $C_{nA}$ which as the only capacitor is then connected to the second end of the first current source I and to the non-inverting input of the third comparator K3 through the top plate change-over switch $S_{TnA}$. The voltage $U_{nA}$ increasing on the additional sampling capacitor is compared to the converted voltage value $U_N$ by the use of the third comparator K3.

In case if the control module CM detects the next trigger signal on the trigger input InS when the voltage $U_n$ on the sampling capacitor reaches the converted voltage value $U_{IN}$, electric charge delivered still by the use of the first current source I is accumulated in the additional sampling capacitor $C_{nA}$ which as the only capacitor is then connected to the second end of the first current source I and to the non-inverting input of the third comparator K3 through the top plate change-over switch $S_{TnA}$. The voltage $U_{nA}$ increasing on the additional sampling capacitor is compared to the converted voltage value $U_{IN}$ by the use of the third comparator K3.

In both cases, the control module CM introduces the complete conversion output OutR into the inactive state and assigns the initial value zero to all the bits $b_{n-1}$, $b_{n-2}$, ..., $b_1$, $b_0$ in the digital word. Then, the control module CM assigns the function of the source capacitor $C_i$ to the sampling capacitor $C_n$ by writing the value of the index of the sampling capacitor to the source index register. Simultaneously, the control module CM assigns the function of the destination capacitor $C_k$ to the capacitor $C_{n-1}$ having the highest capacitance value in the array of redistribution by writing the value of the index of the capacitor having the highest capacitance value in the array of redistribution to the destination index register. Next, the control module CM starts to realize the process of redistribution of the accumulated electric charge. Therefore, the control module CM by the use of the signal from the output controlling the second current source $A_J$ causes the switching on the second current source J. The charge accumulated in the source capacitor $C_i$ is transferred to the destination capacitor $C_k$ by the use of the second current source J though the source rail H and the destination rail L and the voltage $U_i$ on the source capacitor gradually decreases and at the same time the voltage $U_k$ on the destination capacitor gradually increases during the charge transfer.

In case when the voltage $U_k$ on the current destination capacitor $C_k$ reaches the reference voltage $U_L$ value, then the value one is assigned by the control module CM to the appropriate bit $b_k$ in the digital word on the basis of the output signal of the second comparator K2. By the use of the signal from the control output $I_k$, the control module CM causes the opening of the destination on-off switch $S_{Lk}$ and the disconnection of the top plate of the destination capacitor $C_k$ from the destination rail L, the simultaneous the switching of the ground change-over switch $S_{Gk}$ and the connection of the bottom plate of the destination capacitor $C_k$ to the source of auxiliary voltage $U_H$. Next, the control module CM assigns the function of the destination capacitor $C_k$ to the subsequent capacitor in the array of redistribution A whose capacitance value is twice lower than the capacitance value of the capacitor that acted as the destination comparator $C_k$ directly before by reducing the content of the destination index register by one. By the use of the signal from the control output $I_k$, the control module CM causes the closure of the destination on-off switch $S_{Lk}$ and the connection of the top plate of a new destination capacitor $C_k$ to the destination rail L, the simultaneous switching of the ground change-over switch $S_{Gk}$ and the connection of the bottom plate of the destination capacitor $C_k$ to ground of the circuit.

Figure 4:
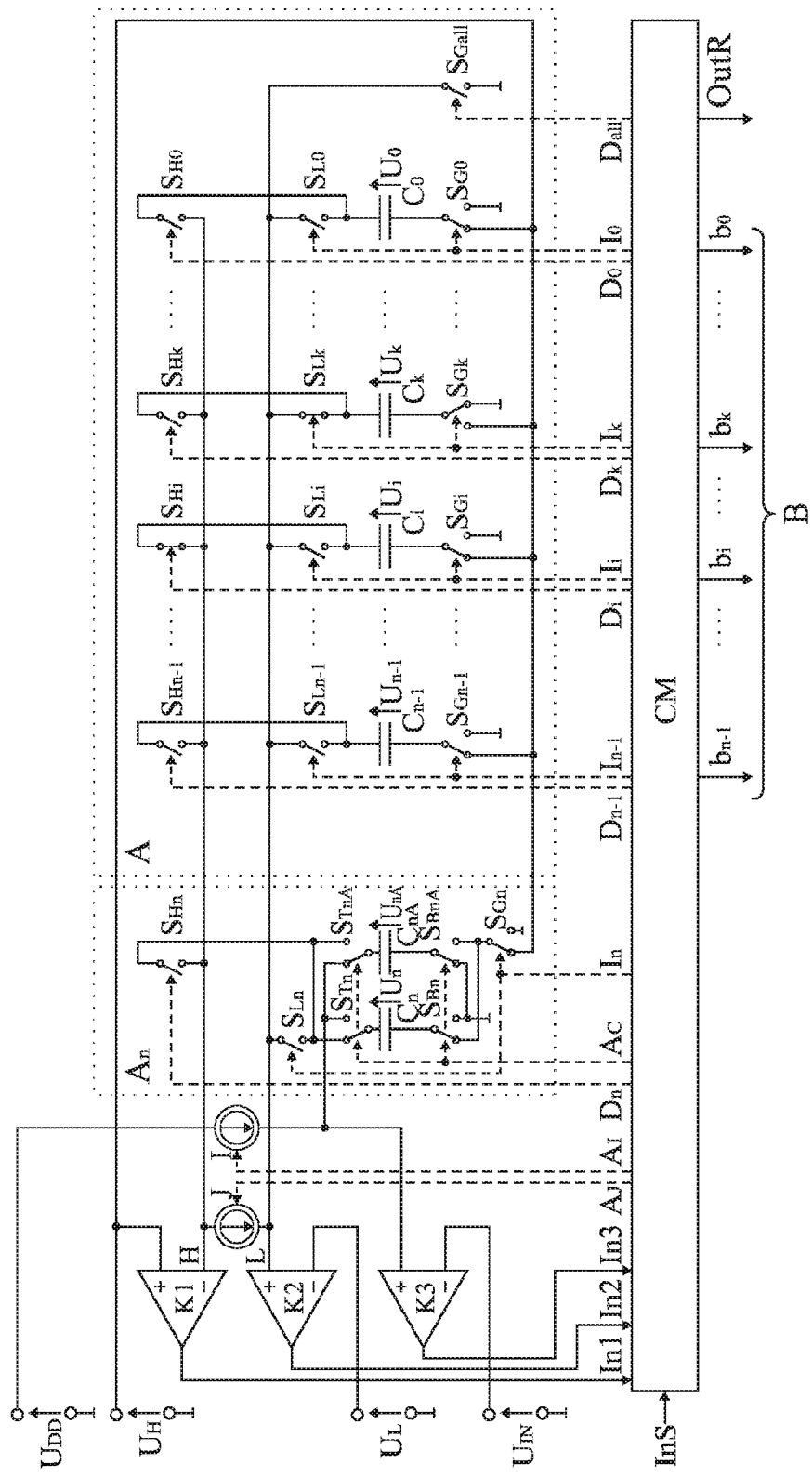
FIG. 4 illustrates the schematic diagram of the apparatus during the charge transfer from the source capacitor $C_i$ to the destination capacitor $C_k$.

In case when the voltage $U_i$ on the source capacitor reaches the value zero during charge transfer, then on the basis of the output signal of the first comparator K1 the control module CM by the use of the signal from the control output $D_i$ causes the opening of the source on-off switch $S_{Hi}$ and the disconnection of the top plate of the source capacitor $C_i$ from the source rail H. By the use of the signal from the control output $I_k$, the control module CM causes the opening of the destination on-off switch $S_{Lk}$ and the disconnection of the top plate of the destination capacitor $C_k$ from the destination rail L, the simultaneous switching of the ground change-over switch $S_{Gk}$ and the connection of the bottom plate of the destination capacitor $C_k$ to the source of auxiliary voltage $U_H$. Next, the function of the source capacitor $C_i$ is assigned by the control module CM to the capacitor that acted as the destination capacitor $C_k$ directly before by writing the current content of the destination index register to the source index register. The control module CM by the use of the signal from the control output $D_i$ causes the closure of the source on-off switch $S_{Hi}$ and the connection of the top plate of a new source capacitor $C_i$ to the source rail H. Then, the control module CM reduces the content of the destination index register by one and assigns the function of the destination capacitor $C_k$ to the next capacitor in the array of redistribution A having a capacitance value twice lower than the capacitance value of the capacitor that acted as the destination capacitor $C_k$ directly before. By the use of the signal from the control output $I_k$, the control module CM causes the closure of the destination on-off switch $S_{Lk}$ and the connection of the top plate of a new destination capacitor $C_k$ to the destination rail L, the simultaneous switching of the ground change-over switch $S_{Gk}$ and the connection of the bottom plate of a new destination capacitor $C_k$ to ground of the circuit. FIG. 4 presents the apparatus in the abovementioned state.

In both abovementioned cases, the control module CM continues the process of electric charge redistribution on the basis of the output signals of the first comparator K1 and of the second comparator K2. Each occurrence of the active state on the output of the second comparator K2 causes the assignment of the function of the destination capacitor $C_k$ to the subsequent capacitor in the array of redistribution A whose capacitance value is twice as lower as the capacitance value of the capacitor which acted as the destination capacitor $C_k$ directly before. On the other hand, each occurrence of the active state on the output of first comparator K1 causes the assignment of the function of the source capacitor $C_i$ to the capacitor in the array of redistribution A that until now has acted as the destination capacitor $C_k$, and at the same time the assignment of the function of the destination capacitor $C_k$ to the subsequent capacitor in the array A whose capacitance value is twice as lower as the capacitance value of the capacitor which acted as the destination capacitor directly before. The process of redistribution is terminated when the capacitor $C_0$ having the lowest capacitance value in the array of redistribution A stops to act as the destination capacitor $C_k$. Such situation occurs when the active state appears on the output of the first comparator K1 or on the output of the second comparator K2 during charge transfer to the capacitor $C_0$ having the lowest capacitance value in the array of redistribution A. When the active state appears on the output of the second comparator K2, the control module CM assigns the value one to the bit $b_0$. After termination of redistribution of charge accumulated previously in the sampling capacitor $C_n$ and after assigning the corresponding values to the bits $b_{n-1}$, $b_{n-2}, \ldots, b_1, b_0$ in the output digital word, the control module CM activates the signal provided on the complete conversion signal output OutR. By the use of the signal from the output controlling the second current source $A_J$, the control module CM causes the switching off the second current source J. Next, the control module CM introduces the apparatus into the relaxation phase as shown in FIG. 1.

Figure 5:
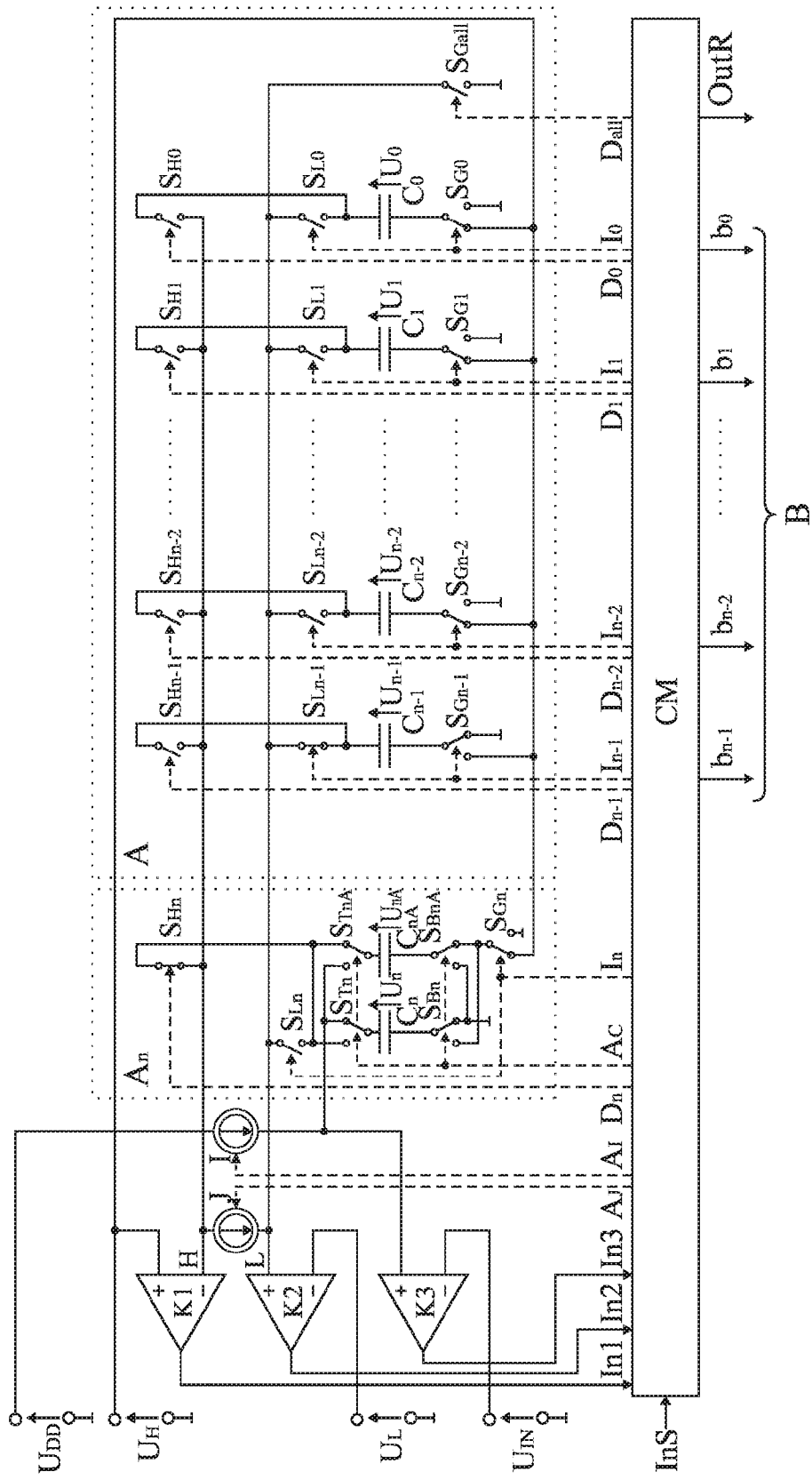
FIG. 5 illustrates the schematic diagram at the beginning of redistribution of charge accumulated in the additional sampling capacitor $C_{nA}$.

As soon as the voltage $U_{nA}$ on the additional sampling capacitor reaches the converted voltage value $U_{IN}$, the control module CM on the basis of the output signal of the third comparator K3 introduces the apparatus in the state shown in FIG. 5. Therefore, the control module CM by the use of the signal from the control output $D_{all}$ causes the opening of the destination rail on-off switch $S_{Gall}$ and the disconnection of the destination rail L from ground of the circuit. The control module CM by the use of signals from the control outputs $I_n$; $I_{n-2}, \ldots, I_1, I_0$ causes the opening of the destination on-off switches $S_{Ln}$; $S_{Ln-2}, \ldots, S_{L1}, S_{L0}$ and the disconnection of the top plates of the sampling capacitor $C_n$ and of the capacitors $C_{n-2}, \ldots, C_1, C_0$ in the array of redistribution from the destination rail L, the switching of the ground change-over switches $S_{Gn}$; $S_{Gn-2}, \ldots, S_{G1}, S_{G0}$ and the connection of the bottom plates of the sampling capacitor $C_n$ and of the capacitors $C_{n-2}, \ldots, C_1, C_0$ in the array of redistribution to the source of auxiliary voltage $U_H$. By the use of the signal from the output controlling change-over switches of plates $A_C$, the control module CM causes the switching of the top plate change-over switches $S_{Tn}$, $S_{TnA}$ and of the bottom plate change-over switches $S_{Bn}$, $S_{BnA}$ and the connection of the top plate of the sampling capacitor $C_n$ to the other end of the first current source I and to the non-inverting input of the third comparator K3, the connection of the top plate of the additional sampling capacitor $C_{nA}$ to the source on-off switch $S_{Hn}$ and to the destination on-off switch $S_{Ln}$, the connection of the bottom plate of the sampling capacitor $C_n$ to ground of the circuit and the connection of the bottom plate of the additional sampling capacitor $C_{nA}$ to the ground change-over switch $S_{Gn}$.

In case if the control module CM does not detect the next trigger signal on the trigger input InS when the voltage $U_{nA}$ on the additional sampling capacitor reaches the converted voltage value $U_{IN}$, the control module CM on the basis of the output signal of the third comparator K3 causes the switching off the first current source I by the use of the signal from the output controlling the first current source $A_I$.

As soon as the trigger signal on the trigger input InS is detected by the control module CM, the first current source I, the control module CM by the use of the signal from the output controlling the first current source $A_I$ causes the switching on the first current source I again. Electric charge delivered by the use of the first current source I is accumulated in the sampling capacitor $C_n$ which as the only capacitor is then connected to the second end of the first current source I and to the non-inverting input of the third comparator K3 through the top plate change-over switch $S_{Tn}$. The voltage $U_n$ increasing on the sampling capacitor is compared to the converted voltage value $U_{IN}$ by the use of the third comparator K3.

In case if the control module CM detects the next trigger signal on the trigger input InS when the voltage $U_{nA}$ on the additional sampling capacitor reaches the converted voltage value $U_{IN}$, electric charge delivered still by the use of the first current source I is accumulated in the sampling capacitor $C_n$ which as the only capacitor is then connected to the second end of the first current source I and to the non-inverting input of the third comparator K3 through the top plate change-over switch $S_{Tn}$. The voltage $U_n$ increasing on the sampling capacitor is compared to the converted voltage value $U_{IN}$ by the use of the third comparator K3.

In both cases, the control module CM deactivates the signal provided on the complete conversion signal output OutR and assigns the initial value zero to all the bits $b_{n-1}, b_{n-2}, \ldots, b_1$, $b_0$ in the digital word. Then, the control module CM assigns the function of the source capacitor $C_i$ to the additional sampling capacitor $C_{nA}$ by writing the value of the sampling capacitor $C_n$ index to the source index register. Simultaneously, the control module CM assigns the function of the destination capacitor $C_k$ to the capacitor $C_{n-1}$ having the highest capacitance value in the array of redistribution by writing a value of the index of the capacitor $C_{n-1}$ having the highest capacitance value in the array of redistribution to the destination index register. Next, the control module CM by the use of the signal from the output controlling the second current source $A_J$ causes the switching on the current source J and starts to realize the process of redistribution of charge accumulated in the additional sampling capacitor $C_{nA}$. The process of redistribution is terminated when the capacitor $C_0$ having the lowest capacitance value in the array of redistribution A stops to act as the destination capacitor $C_k$. After termination of redistribution of charge accumulated previously in the additional sampling capacitor $C_{nA}$ and after assigning the corresponding values to the bits $b_{n-1}, b_{n-2}, \ldots$, $b_1, b_0$ in the digital word, the control module CM activates the complete conversion signal output OutR. By the use of the signal from the output controlling the second current source $A_J$, the control module CM causes the switching off the current source J. Next, the control module CM introduces the apparatus into the relaxation phase shown in FIG. 2.

Figure 6:
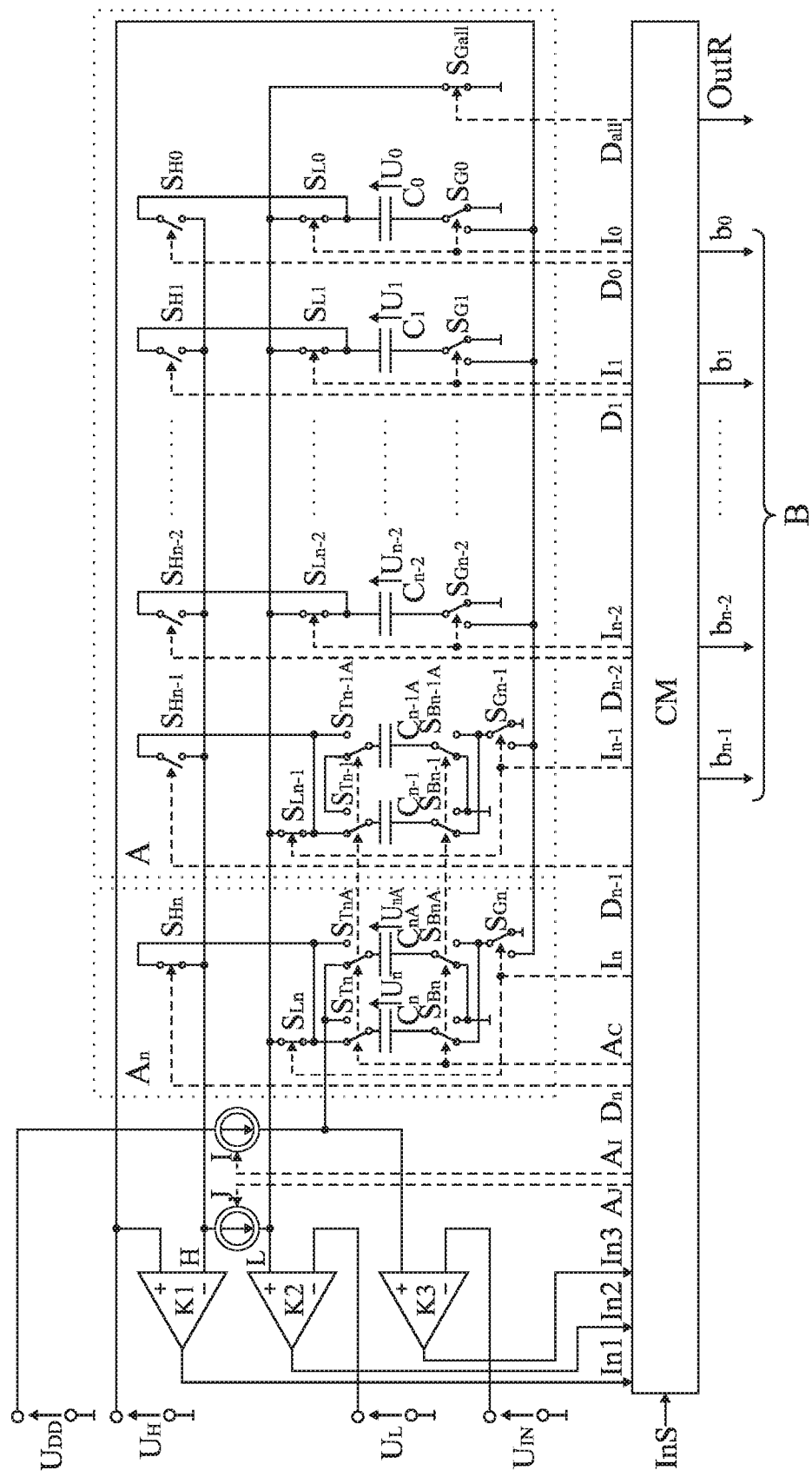
FIG. 6 illustrates the schematic diagram of the apparatus in the state of relaxation before the start of conversion.

The method for conversion of a voltage value to the digital word realized in the second exemplary apparatus is as follows. Before the start of the first process of conversion of a voltage value to the digital word having the number of bits equal to n, the control module CM by the use of the signal from the output controlling the change-over switches of plates $A_C$ causes additionally the switching of top plate change-over switches $S_{Tn-1}$, $S_{Tn-1A}$ and of the bottom plate change-over switches $S_{Bn-1}$, $S_{Bn-1A}$ and the connection of the top plate of the capacitor $C_{n-1A}$ having the highest capacitance value in the array of redistribution to the source on-off switch $S_{Hn-1}$ and to the destination on-off switch $S_{Ln-1}$, the connection of the top plate of the additional capacitor $C_{n-1A}$ having the highest capacitance value in the array of redistribution to the other end of the first current source I and to the non-inverting input of the third comparator K3, the connection of the bottom plate of the capacitor $C_{n-1}$ having the highest capacitance value in the array of redistribution to the ground change-over switch $S_{Gn-1}$ and the connection of the bottom plate of the additional capacitor $C_{n-1A}$ having the highest capacitance value in the array of redistribution to ground of the circuit. FIG. 6 presents the abovementioned state of the apparatus.

Figure 7:
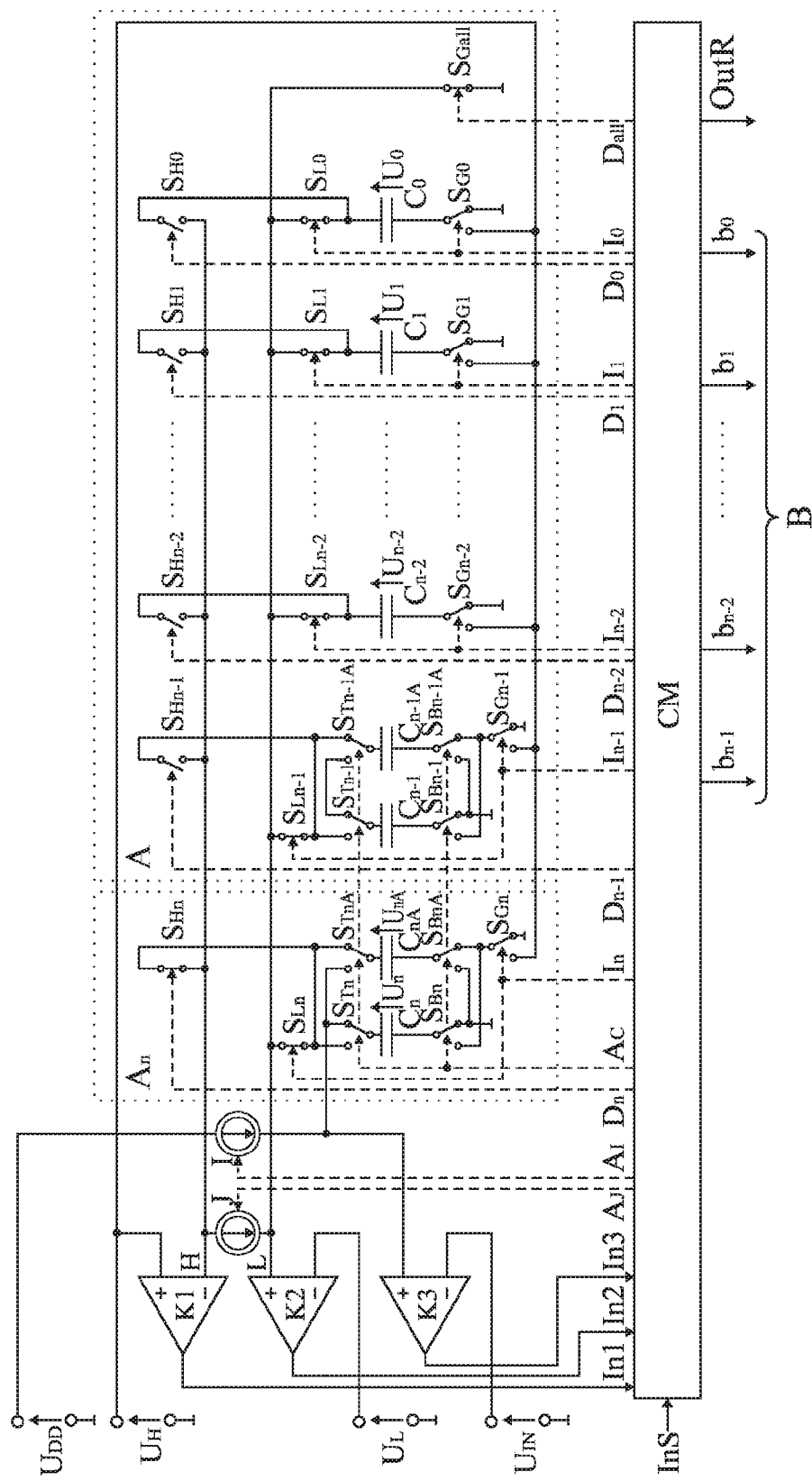
FIG. 7 illustrates the schematic diagram during accumulation of charge in the sampling capacitor $C_n$ and in the capacitor $C_{n-1}$ which is connected to the sampling capacitor $C_n$ in parallel.

As soon as the trigger signal is detected by the control module CM on the trigger input InS, the control module CM by the use of the signal from the output controlling the change-over switches of plates $A_c$ causes additionally the switching of the top plate change-over switches $S_{Tn-1}$, $S_{Tn-1A}$ and of the bottom plate change-over switches $S_{B-1n}$, $S_{Bn-1A}$ and the connection of the top plate of the sampling capacitor $C_{n-1}$ having the highest capacitance value in the array of redistribution to the other end of the first current source I and to the non-inverting input of the third comparator K3, the connection of the top plate of the additional capacitor $C_{n-1A}$ having the highest capacitance value in the array of redistribution to the source on-off switch $S_{Hn-1}$ and to the destination on-off switch $S_{Ln-1}$, the connection of the bottom plate of the sampling capacitor $C_{n-1}$ having the highest capacitance value in the array of redistribution to ground of the circuit and the connection of the bottom plate of the additional capacitor $C_{n-1A}$ having the highest capacitance value in the array of redistribution to the ground change-over switch $S_{Gn-1}$ enforcing a complete discharge of the additional capacitor $C_{n-1A}$ having the highest capacitance value in the array of redistribution. Electric charge delivered by the first current source is accumulated simultaneously in the sampling capacitor $C_n$ and in the capacitor $C_{n-1}$ having the highest capacitance value in the array of redistribution which is connected to the sampling capacitor $C_n$ in parallel. Both capacitors ($C_n$ and $C_{n-1}$) are the only capacitors that are connected to the other end of the first current source I and to the non-inverting input of the third comparator K3 through the top plate change-over switches $S_{Tn}$, $S_{Tn-1}$. FIG. 7 presents the abovementioned state of the apparatus.

Figure 8:
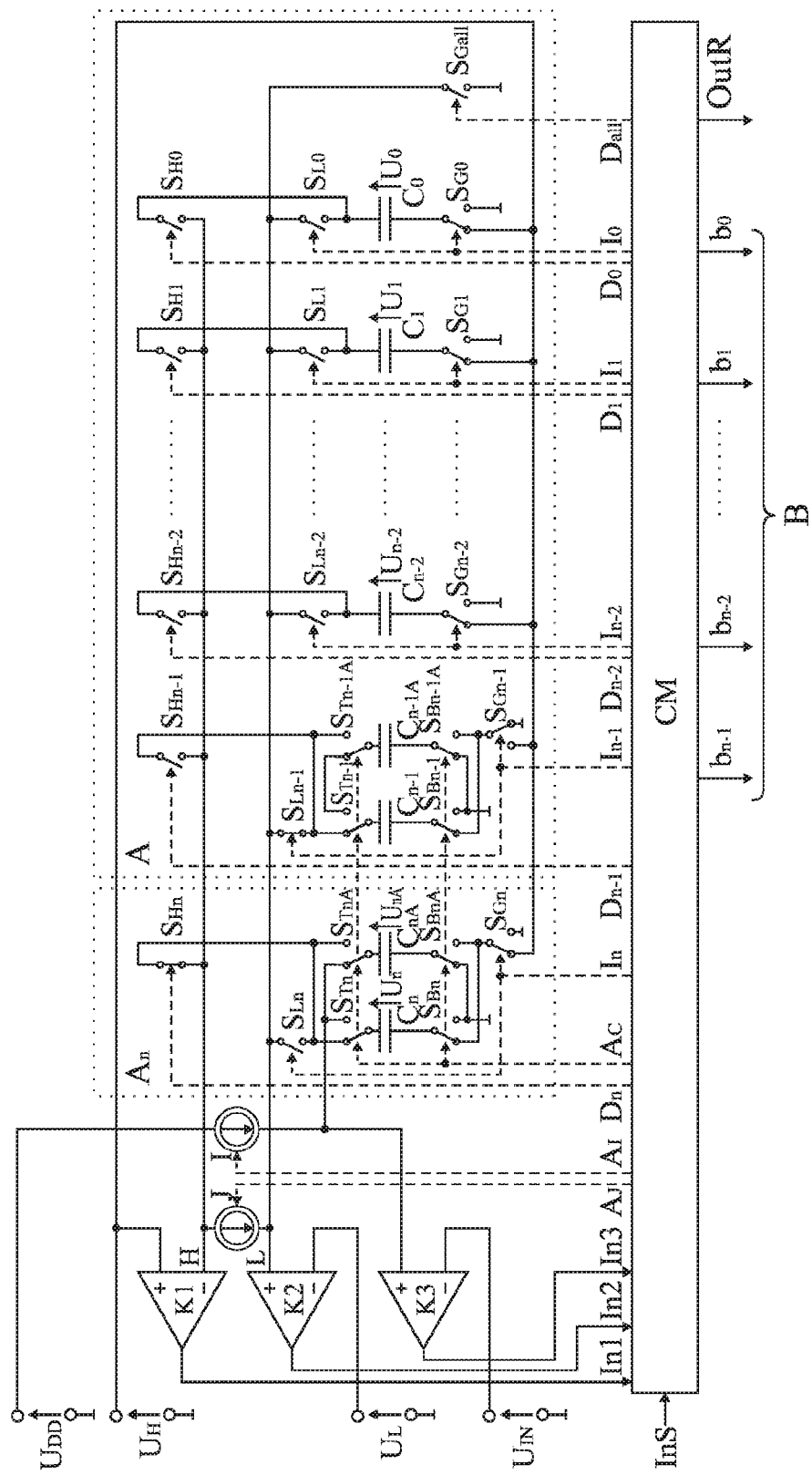
FIG. 8 illustrates the schematic diagram at the beginning of redistribution of charge accumulated in the sampling capacitor $C_n$ and in the capacitor $C_{n-1}$.

As soon as the voltage $U_n$ on the sampling capacitor reaches the converted voltage value $U_{IN}$, the control module CM on the basis of the output signal of the third comparator K3 by the use of the signal from the output controlling the change-over switches of plates $A_C$ causes additionally the switching of the top plate change-over switches $S_{Tn-1}$, $S_{Tn-1A}$ and of the bottom plate change-over switches $S_{Bn-1}$, $S_{Bn-1A}$ and the connection of the top plate of the capacitor $C_{n-1}$ having the highest capacitance value in the array of redistribution to the source on-off switch $S_{Hn-1}$ and to the destination on-off switch $S_{Ln-1}$, the connection of the top plate of the additional capacitor $C_{n-1A}$ having the highest capacitance value in the array of redistribution to the other end of the first current source I and to the non-inverting input of the third comparator K3, the connection of the bottom plate of the capacitor $C_{n-1}$ having the highest capacitance value in the array of redistribution to the ground change-over switch $S_{Gn}$ and the connection of the bottom plate of the additional capacitor $C_{n-1A}$ having the highest capacitance value in the array of redistribution to ground of the circuit. FIG. 8 presents the abovementioned state of the apparatus.

As soon as the trigger signal is detected by the control module CM on the trigger input InS, electric charge delivered by the use of the first current source I is accumulated simultaneously in the additional sampling capacitor $C_{nA}$ and in the capacitor $C_{n-1A}$ having the highest capacitance value in the array of redistribution which is connected to the sampling capacitor $C_n$ in parallel. Both capacitors $C_{nA}$ and $C_{n-1A}$) are the only capacitors that are connected to the other end of the first current source I and to the non-inverting input of the third comparator K3 through the top plate change-over switches $S_{TnA}$, $S_{Tn-1A}$.

Figure 9:
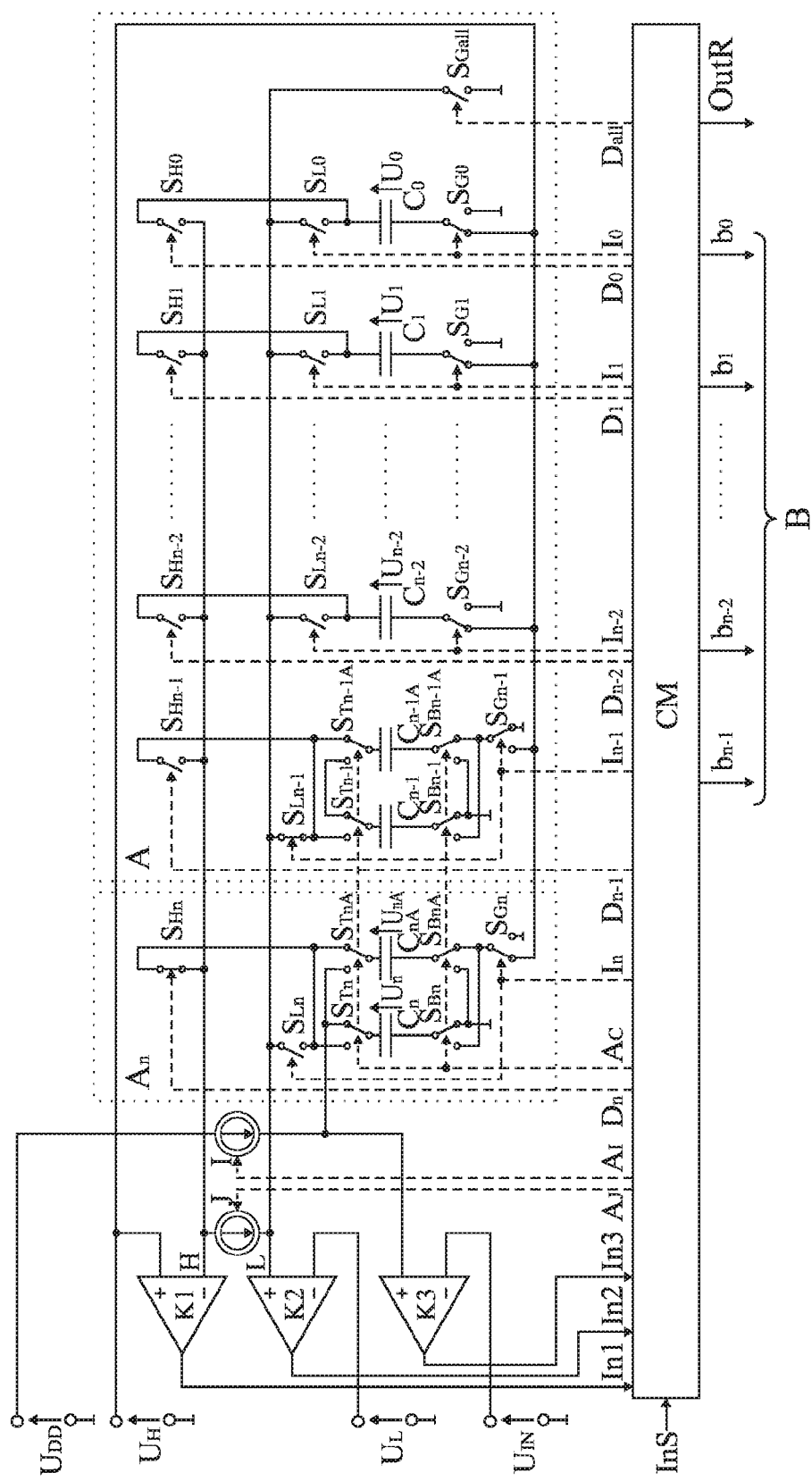
FIG. 9 illustrates the schematic diagram at the beginning of redistribution of charge accumulated in the additional sampling capacitor $C_{nA}$ and in the additional capacitor $C_{n-1A}$.

As soon as the voltage $U_{nA}$ on the additional sampling capacitor reaches the converted voltage value $U_{IN}$, the control module CM on the basis of the output signal of the third comparator K3 by the use of the signal from the output controlling the change-over switches of plates $A_C$ causes additionally the switching of the top plate change-over switches $S_{Tn-1}$, $S_{Tn-1A}$ and of the bottom plate change-over switches $S_{Bn-1}$, $S_{Bn-1A}$ and the connection of the top plate of the capacitor $C_{n-1}$ having the highest capacitance value in the array of redistribution to the other end of the first current source I and to the non-inverting input of the third comparator K3, the connection of the top plate of the additional capacitor $C_{n-1A}$ having the highest capacitance value in the array of redistribution to the source on-off switch $S_{Hn-1}$ and to the destination on-off switch $S_{Ln-1}$, the connection of the bottom plate of the capacitor $C_{n-1}$ having the highest capacitance value in the array of redistribution to ground of the circuit and the connection of the bottom plate of the additional capacitor $C_{n-1A}$ having the highest capacitance value in the array of redistribution to the change-over switch $S_{Gn-1}$. FIG. 9 presents the abovementioned state of the apparatus.

Another method for conversion of a voltage value to the digital word realized according to the invention in the exemplary apparatus differs from the previous methods in that as soon as the process of accumulated electric charge redistribution is terminated, the control module CM causes the electric charge, accumulated in the last of capacitors on which the reference voltage $U_L$ had not been reached during realization of the process of redistribution, to be conserved.

If the control module CM assigns the value zero to the bit $b_0$ during the realization of the process of charge redistribution, the control module CM introducing the apparatus into the relaxation state by the use of the signal from the control output $I_0$ causes the opening of the destination on-off switch $S_{L0}$ and the disconnection of the top plate of the capacitor $C_0$ having the lowest capacitance value in the array of redistribution from the destination rail L, the switching of the ground change-over switch $S_{G0}$ and the connection of the bottom plate of the capacitor $C_0$ having the lowest capacitance value in the array of redistribution to the source of auxiliary voltage $U_H$.

If the control module CM assigns the value one to the bit $b_0$ during the realization of the process of redistribution, the control module CM introducing the apparatus into relaxation state by the use of the signal from the control output $I_i$ causes the opening the destination on-off switch $S_{Li}$, and the disconnection of the top plate of the source capacitor $C_i$ from the destination rail L, the switching of the ground change-over switch $S_{Gi}$ and the connection of the bottom plate of the source capacitor $C_i$ to the source of auxiliary voltage $U_H$.

REFERENCES/ABBREVIATIONS

A array of redistribution
$A_n$ section of sampling capacitor
CM control module

K1 the first comparator
K2 the second comparator
K3 the third comparator
I the first current source
J the second current source
$U_H$ source of auxiliary voltage
$U_L$ source of the reference voltage
$U_{IN}$ converted voltage
$U_{DD}$ supply voltage
InS trigger input
In1 the first control input of the control module
In2 the second control input of the control module
In3 the third control input of the control module
B digital output of the control module
OutR complete conversion output
H source rail
L destination rail
$C_n$ sampling capacitor
$C_{n-1}, C_{n-2}, \ldots, C_1, C_0$ capacitors in the array of redistribution
$C_{n-1}$ capacitor having the highest capacitance value in the array of redistribution
$C_0$ capacitor having the lowest capacitance value in the array of redistribution
$C_{nA}$ additional sampling capacitor
$C_{n-1A}$ additional capacitor having the highest capacitance value in the array of redistribution
$C_i$ source capacitor
$C_k$ destination capacitor
$U_{n-1}, U_{n-2}, \ldots, U_1, U_0$ voltages on the capacitors in the array of redistribution
$U_n$ voltage on the sampling capacitor
$U_{nA}$ voltage on the additional sampling capacitor
$U_i$ voltage on the source capacitor
$U_k$ voltage on the destination capacitor
$b_{n-1}, b_{n-2}, \ldots, b_i, \ldots, b_k, \ldots, b_1, b_0$ bits in the digital word
$S_{Hn}, S_{Hn-1}, S_{Hn-2}, \ldots, S_{Hi}, \ldots, S_{Hk}, \ldots, S_{H1}, S_{H0}$ source on-off switches
$S_{Ln}, S_{Ln-1}, S_{Ln-2}, \ldots, S_{Li}, \ldots, S_{Lk}, \ldots, S_{L1}, S_{L0}$ destination on-off switches
$S_{Gn}, S_{Gn-1}, S_{Gn-2}, \ldots, S_{Gi}, \ldots, S_{Gk}, \ldots, S_{G1}, S_{G0}$ ground change-over switches
$S_{Tn}, S_{Tn-1}, S_{TnA}, S_{Tn-1A}$ top plate change-over switches
$S_{Bn}, S_{Bn-1}, S_{BnA}, S_{Bn-1A}$ bottom plate change-over switches
$S_{Gall}$ destination rail on-off switch
$A_C$ output controlling change-over switches of the plates
$A_I$ output controlling the first current source
$A_J$ output controlling the second current source
$I_n, I_{n-1}, I_{n-2}, \ldots, I_i, \ldots, I_k, \ldots, I_1, I_0$ control outputs
$D_n, D_{n-1}, D_{n-2}, \ldots, D_i, \ldots, D_k, \ldots, D_1, D_0, D_{all}$ control outputs

The invention claimed is:

1. A method for clockless conversion of voltage value to digital word consisting in a detection of a trigger signal by the use of a control module and in mapping the converted voltage value to a portion of electric charge proportional to this converted voltage value delivered by use of a current source while a portion of electric charge is accumulated in a sampling capacitor or in the sampling capacitor and in a capacitor having a highest capacitance value in an array of redistribution, which is connected in parallel to the sampling capacitor, until a voltage increasing on the sampling capacitor observed at the same time by the use of a comparator is equal to the converted voltage value, and then consisting in a realization of a process of accumulated electric charge redistribution in the array of redistribution in a known way by means of the control module by changes of states of signals from relevant control outputs, while the array of redistribution comprises an array of on-off switches, of change-over switches and of capacitors such that a capacitance value of each capacitor of a given index is twice as high as a capacitance value of a capacitor of a previous index, and also consisting in an assignment of relevant values to bits of the digital word by means of the control module characterized in that after termination of accumulation of electric charge in the sampling capacitor ($C_n$) or in the sampling capacitor ($C_n$) and in the capacitor ($C_{n-1}$) having the highest capacitance value in the array of redistribution which is connected to the sampling capacitor ($C_n$) in parallel and after detection of the trigger signal by means of the control module (CM), electric charge is accumulated in the additional sampling capacitor ($C_{nA}$), and next the process of redistribution of electric charge accumulated in the additional sampling capacitor ($C_{nA}$) is realized and relevant values are assigned to bits ($b_{n-1}, b_{n-2}, \ldots, b_1, b_0$) in the digital word by means of the control module (CM) while accumulation of electric charge in the additional sampling capacitor ($C_{nA}$) and the process of redistribution of electric charge accumulated in the additional sampling capacitor ($C_{nA}$) and assignment of relevant values to bits ($b_{n-1}, b_{n-2}, \ldots, b_1, b_0$) in the digital word are realized such as for the sampling capacitor ($C_n$).

2. The method for conversion as claimed in claim 1 characterized in that after termination of accumulation of electric charge in the additional sampling capacitor ($C_{nA}$) and after detection of the trigger signal by means of the control module (CM), the next cycle begins and electric charge is delivered by the use of the current source and accumulated again in the sampling capacitor ($C_n$) or in the sampling capacitor ($C_n$) and in the capacitor ($C_{n-1}$) having the highest capacitance value in the array of redistribution which is connected to the sampling capacitor ($C_n$) in parallel.

3. The method for conversion as claimed in claim 1 characterized in that when electric charge is delivered by the use of current source and is accumulated in the additional sampling capacitor ($C_{nA}$), a part of delivered electric charge is accumulated simultaneously in the additional capacitor ($C_{n-1A}$) having the highest capacitance value in the array of redistribution which is connected to the additional sampling capacitor ($C_{nA}$) in parallel, while a capacitance value of the additional capacitor ($C_{n-1A}$) having the highest capacitance value in the array of redistribution equals the capacitance value of the capacitor ($C_{n-1A}$) having the highest capacitance value in the array of redistribution.

4. The method for conversion as claimed in claim 1 characterized in that after termination of process of redistribution, the charge, accumulated in the last of capacitors on which the reference voltage ($U_L$) had not been reached when the process of redistribution was realized, is conserved.

5. An apparatus for clockless conversion of voltage value to digital word comprising an array of redistribution whose control inputs are connected to control outputs of a control module and the control module is equipped with a digital output, a complete conversion output, a trigger input, a first control input connected to an output of a first comparator and a second control input connected to an output of a second comparator whereas a source of auxiliary voltage, a section of the sampling capacitor and a second controlled current source whose control input is connected to a relevant output controlling the second current source are connected to array of redistribution while the first end of the second current source is connected to a source rail and the other end of the second current source is connected to a destination rail while a source of supply voltage is connected to the first end of the first current source whose control input is connected to an output controlling the first current source whereas the array of redistribution comprises sections whose number equals a number of bits in the digital word, and a section of the sampling capacitor and each section of the array of redistribution comprises a source on-off switch, a destination on-off switch, a ground change-over switch and at least one capacitor whose top plate is connected to the source rail through the source on-off switch and/or to the destination rail through the destination on-off switch and whose bottom plate is connected to ground of the circuit or to the source of auxiliary voltage through the ground change-over switch while a capacitance value of each capacitor of a given index in the array of redistribution is twice as high as a capacitance value of a capacitor of the previous index and also the destination rail is connected to ground of the circuit through the destination on-off switch to the non-inverting input of the second comparator whose inverting input is connected to the source of the reference voltage and the source rail is connected to the inverting input of the first comparator whose non-inverting input is connected to the source of auxiliary voltage whereas the control inputs of the source on-off switches and the control inputs of the destination rail are connected appropriately to the control outputs of the control module and the control inputs of the destination on-off switches are coupled together and connected appropriately to the control outputs of the control module characterized in that the control module (CM) is equipped with the third control input (In3) connected to the output of the third comparator (K3) whose inverting input is connected to the source of converted voltage ($U_{IN}$) and the non-inverting input of the third comparator (K3) is connected to the other end of the first current source (I) and to the section of the sampling capacitor ($A_n$) which comprises the additional sampling capacitor ($C_{nA}$), the top plate change-over switches ($S_{Tn}$, $S_{TnA}$), the bottom plate change-over switches ($S_{Bn}$, $S_{BnA}$) while the top plate of the sampling capacitor ($C_n$) and the top plate of the additional sampling capacitor ($C_{n-1}$) are connected through the top plate change-over switches ($S_{Tn}$, $S_{TnA}$) to the source on-off switch ($S_{Hn}$) and to the destination on-off switch ($S_{Ln}$) or to the other end of the first current source (I) and to the non-inverting input of the third comparator (K3) whereas the bottom plate of the sampling capacitor ($C_n$) and the bottom plate of the additional sampling capacitor ($C_{nA}$) are connected to the ground change-over switches ($S_{Gn}$) or to ground of the circuit through the bottom plate change-over switches ($S_{Bn}$, $S_{BnA}$) and the control inputs of the top plate change-over switches ($S_{Tn}$, $S_{TnA}$) and the control inputs of the bottom plate change-over switches ($S_{Bn}$, $S_{BnA}$) are coupled together and connected appropriately to the output controlling the change-over switches of the plates ($A_C$).

6. The apparatus for conversion as claimed in claim 5 characterized in that at least one section in the array of redistribution (A) comprises the additional capacitor ($C_{n-1A}$, $C_{n-2A}$, ..., $C_{1A}$, $C_{0A}$), the top plate change-over switches ($S_{Tn-1}$, $S_{Tn-2}$, ..., $S_{T1}$, $S_{T0}$; $S_{Tn-1A}$, $S_{Tn-2A}$, ..., $S_{T1A}$, $S_{T0A}$) and the bottom plate change-over switches ($S_{Bn-1}$, $S_{Bn-2}$, ..., $S_{B1}$, $S_{B0}$; $S_{Bn-1A}$, $S_{Bn-2A}$, ..., $S_{B1A}$, $S_{B0A}$) while the top plates of the capacitors ($C_{n-1}$, $C_{n-2}$, $C_1$, $C_0$) and the top plates of the additional capacitors ($C_{n-1A}$, $C_{n-2A}$, ..., $C_{1A}$, $C_{0A}$) are connected appropriately to the source on-off switches ($S_{Hn-1}$, $S_{Hn-2}$, ..., $S_{H1}$, $S_{H0}$) and to the destination on-off switches ($S_{Ln-1}$, $S_{Ln-2}$, ..., $S_{L1}$, $S_{L0}$) or to the other end of the first current source (I) and to the non-inverting input of the third comparator (K3) whereas the bottom plates of the capacitors ($C_{n-1}$, $C_{n-2}$, ..., $C_1$, $C_0$) and the bottom plates of the additional capacitors ($C_{n-1A}$, $C_{n-2A}$, ..., $C_{1A}$, $C_{0A}$) are connected appropriately to the ground change-over switches ($S_{Gn-1}$, $S_{Gn-2}$, ..., $S_{G1}$, $S_{G0}$) or to ground of the circuit through the bottom plate change-over switches ($S_{Bn-1}$, $S_{Bn-2}$, ..., $S_{B1}$, $S_{B0}$; $S_{Bn-1A}$, $S_{Bn-2A}$, ..., $S_{B1A}$, $S_{B0A}$) whereas the control inputs of the top plate change-over switches ($S_{Tn-1}$, $S_{Tn-2}$, ..., $S_{T1}$, $S_{T0}$; $S_{Tn-1A}$, $S_{Tn-2A}$, ..., $S_{T1A}$, $S_{T0A}$) and the control inputs of the bottom plate change-over switches ($S_{Bn-1}$, $S_{Bn-2}$, ..., $S_{B1}$, $S_{B0}$; $S_{Bn-1A}$, $S_{Bn-2A}$, ..., $S_{B1A}$, $S_{B0A}$) are coupled together and connected to the output controlling the change-over switches of plates ($A_C$).

7. The apparatus for conversion as claimed in claim 6 characterized in that the capacitance value of the sampling capacitor ($C_n$) and the capacitance value of the additional sampling capacitor ($C_{nA}$) are not lower than the capacitance value of the capacitor ($C_{n-1}$) having the highest capacitance value in the array of redistribution.

8. The apparatus for conversion as claimed in claim 6 characterized in that the capacitance value of the additional capacitor ($C_{n-1A}$, $C_{n-2A}$, ..., $C_{1A}$, $C_{0A}$) in the array of redistribution is equal appropriately to the capacitance value of the capacitor ($C_{n-1}$, $C_{n-2}$, ..., $C_1$, $C_0$) in the array of redistribution.

* * * * *